United States Patent
Ge et al.

(10) Patent No.: US 10,081,178 B2
(45) Date of Patent: *Sep. 25, 2018

(54) ADDRESSING AN EPROM

(71) Applicant: HEWLETT-PACKARD DEVELOPMENT COMPANY, L.P., Houston, TX (US)

(72) Inventors: Ning Ge, Palo Alto, CA (US); Leong Yap Chia, Singapore (SG); Wai Mun Wong, Singapore (SG)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/877,971

(22) Filed: Jan. 23, 2018

(65) Prior Publication Data

US 2018/0147839 A1    May 31, 2018

Related U.S. Application Data

(63) Continuation of application No. 15/111,247, filed as application No. PCT/US2014/011976 on Jan. 17, 2014.

(51) Int. Cl.
*G11C 16/08* (2006.01)
*B41J 2/045* (2006.01)
*G11C 16/32* (2006.01)

(52) U.S. Cl.
CPC ......... *B41J 2/04541* (2013.01); *B41J 2/0458* (2013.01); *B41J 2/04543* (2013.01);
(Continued)

(58) Field of Classification Search
CPC .......... G11C 16/08; G11C 16/32; G11C 16/10
See application file for complete search history.

(56) References Cited

U.S. PATENT DOCUMENTS

| 4,153,950 A | 5/1979 | Nosowicz et al. |
| 5,151,876 A | 9/1992 | Ikeda |

(Continued)

FOREIGN PATENT DOCUMENTS

WO    WO-2013048376    4/2013

OTHER PUBLICATIONS

Liou et al; Reduced 30% Scanning Time 3D Multiplexer Integrated Circuit Applied To Large Array Format 20khz Frequency Inkjet Print Heads; © EDA Publishing/DTIP; Apr. 25-27, 2007; http://arxiv.org/ftp/arxiv/papers/0802/0802.3079.pdf.

*Primary Examiner* — Hien Nguyen
(74) *Attorney, Agent, or Firm* — HP Inc. Patent Department

(57) ABSTRACT

Addressing an EPROM on a printhead is described. In an example, a printhead includes an electronically programmable read-only memory (EPROM) having a plurality of cells arranged in rows and columns, each of the cells having a addressing port, a row select port, and a column select port. A conductor is coupled to the addressing portion of each of the plurality of cells. A column shift register is coupled to the column select ports of the plurality of cells, the column shift register having a register location for each column of the plurality of cells and having an input to receive a first input signal. A row shift register is coupled to row select ports of the plurality of cells, the row shift register having a register location for each row of the plurality of cells and having an input to receive a second input signal.

20 Claims, 6 Drawing Sheets

(52) U.S. Cl.
CPC ....... *B41J 2/04581* (2013.01); *B41J 2/04586* (2013.01); *G11C 16/08* (2013.01); *G11C 16/32* (2013.01)

(56) References Cited

U.S. PATENT DOCUMENTS

| | | |
|---|---|---|
| 6,944,739 B2 | 9/2005 | Bartling et al. |
| 7,058,880 B1 | 6/2006 | Ding et al. |
| 8,474,943 B2 | 7/2013 | Ness et al. |
| 8,864,260 B1 | 10/2014 | Ge |
| 9,524,780 B2 | 12/2016 | Villavelez |
| 9,592,664 B2 | 3/2017 | Ge |
| 9,776,397 B2 * | 10/2017 | Ge ................. B41J 2/04541 |
| 2007/0097745 A1 | 5/2007 | Benjamin |
| 2007/0194371 A1 | 8/2007 | Benjamin |
| 2010/0302293 A1 | 12/2010 | Torgerson |
| 2016/0271947 A1 | 9/2016 | Yang |
| 2016/0332439 A1 * | 11/2016 | Ge ................. B41J 2/04541 |

* cited by examiner

ADDRESSING AN EPROM

BACKGROUND

In inkjet printing systems, it is desirable to have several characteristics of each print cartridge easily identifiable by a controller, and it is desirable to have such identification information supplied directly by the print cartridge. The "identification information", for example, can provide information to the printer controller to adjust the operation of the printer and ensure correct operation. A print cartridge can store this identification information using a small, non-volatile memory, such as an erasable programmable read-only memory (EPROM). As print technology evolves, it is desirable to expand the EPROM to store more information. Larger EPROMs, however, lead to longer testing time during manufacture. Longer testing times results in a significant increase in manufacturing cost.

BRIEF DESCRIPTION OF THE DRAWINGS

Some embodiments of the invention are described with respect to the following figures.

DETAILED DESCRIPTION

Addressing an EPROM on a printhead is described. In an example, a printhead for a printer, such as an inkjet printer, includes an EPROM having a plurality of cells arranged in rows and columns. Each cell has a addressing port, a row select port, and a column select port. A conductor is coupled to the addressing port of each of the cells. A column shift register is coupled to the column select ports of the cells and includes a register location for each column of the cells. A row shift register is coupled to the row select ports of the cells and includes a register location for each row of the cells. The column shift register receives an input having a first data signal, and the row shift register receives an input having a second data signal. In operation, a row of the cells is selected by shifting an active logic state into a particular register location of the row shift register. A column of the cells is selected by shifting an active logic state into a particular register location of the column shift register. The conductor can be used to access a cell to retrieve its state (e.g., sense either logic '1' or logic '0' state) if selected by the column shift register and the row shift register.

In this manner, the row and column shift registers can be loaded in parallel to generate an address for the EPROM cell array. This is more efficient than a design having only a scheme of serial shift registers. While a single serial shift register scheme may require less control signals for the printhead, the address must be generated by serially shifting first the row portion and then the column portion. The larger the EPROM cell array, the longer it takes to generate a single address (e.g., in terms of clock cycles) and the longer it takes to read the EPROM (e.g., during testing). The dual bit-shift design described herein reduces the time it takes to generate a single address and thus the time it takes to read the EPROM.

Figure 1:
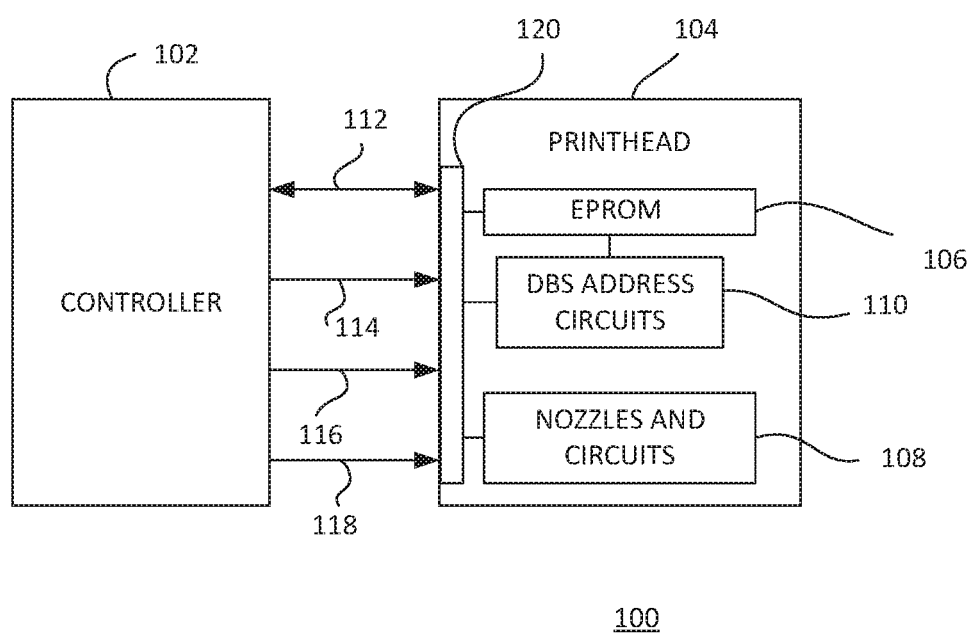
FIG. 1 is a block diagram depicting a printing subsystem according to an example implementation.

FIG. 1 is a block diagram depicting a printing subsystem 100 according to an example implementation. The subsystem 100 can be part of a larger printer system (not shown). The subsystem 100 includes a controller 102 and a printhead 104. The printhead 104 can be part of a larger system, such as an integrated printhead (IPH) system with an attached container (not shown). The printhead 104 includes various nozzles and associated circuits 108 for ejecting ink and printing to media. For example, the printhead 104 can be a thermal inkjet (TIJ) device, piezoelectric inkjet (PIJ) device, or the like.

Figure 4:
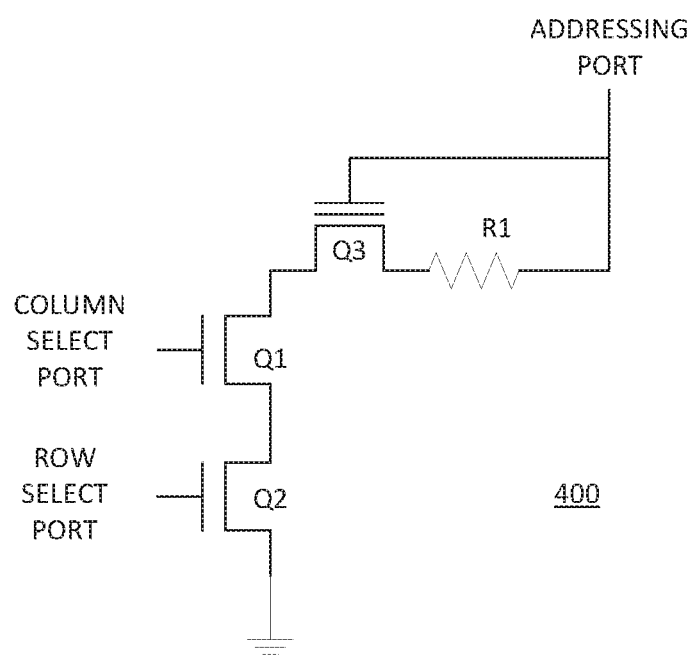
FIG. 4 is a schematic diagram showing an EPROM cell according to an example implementation.

The printhead 104 also includes an electronically programmable read only memory (EPROM) 106 and a dual bit-shift (DBS) address circuit 110. The EPROM 106 can be used to store various information related to the printhead 104 (or IPH), such as identification information, serial numbers, security information, feature information, and the like. As used herein, "EPROM" refers to a non-volatile memory having an array of cells arranged in rows and columns, where each cell can store a single bit of information. Each cell can be programmed with a particular logic state that is retained even when power is removed from the printhead 104. Once programmed, the EPROM 106 can be erased using a known process (e.g., exposure to a strong ultraviolet light source). However, in the context of the printhead 104, the EPROM 106 can be programmed during manufacture and thereafter remain programmed for the life of the printhead 104. Various circuitry for the cells can be used, such as configurations of floating gate field effect transistors (FETs) along with corresponding row and column select FETs. An example cell is shown in FIG. 4.

The EPROM 106 can be of a particular size, e.g., configured to store a particular number of bits. The DBS address circuit 110 can be used to address the EPROM 106 and select particular bits for access. As described below, the DBS address circuit 110 provides separate shift registers for row and column selection, which is more efficient in terms of access time than using a single shift register.

The controller 102 is configured to provide a plurality of signals to the printhead 104. The printhead 104 includes an external interface 120 for receiving the external signals from the controller 102 and providing the signals for use by the EPROM 106, the DBS address circuits 110, and the nozzles and circuits 108. The external interface 120 can include, for example, a sense line (referred to herein as ID line 112), data line(s) 114, clock line(s) 116, fire lines 118, and the like. The ID line 112 can be coupled to each cell in the EPROM 106 and can be used to access each cell (e.g., to read data). The data lines 114 can be used to drive the DBS address circuits 110 for addressing the EPROM 106. The clock lines 116 can be used to provide clock signals for use by logic on the printhead (e.g., the DBS address circuits 110). The fire lines 118 can be used to provide energy for ejecting ink from the nozzles 108. The external interface 120 shown in FIG. 1 is merely an example. Such an interface can include additional lines having different functions.

Figure 2:
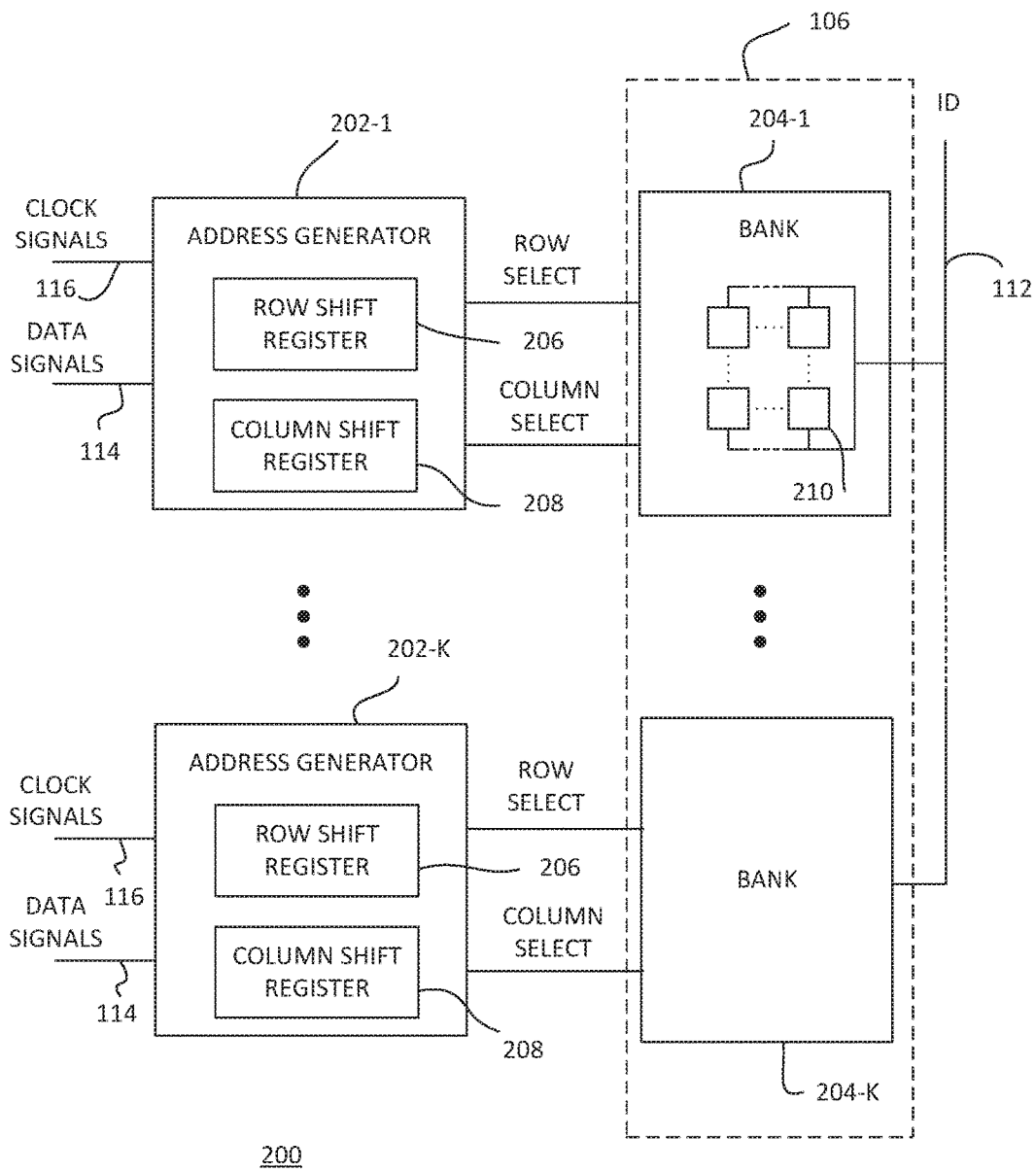
FIG. 2 is a block diagram showing an EPROM subsystem according to an example implementation.

FIG. 2 is a block diagram showing an EPROM subsystem 200 according to an example implementation. Elements of FIG. 2 that are the same or similar to FIG. 1 are designated with identical reference numerals. The EPROM 106 can include at least one bank 204-1 through 204-K, where K is an integer greater than zero (collectively bank(s) 204). Each of the banks 204 can include an array of cells each storing a bit of data. Each of the banks 204 is coupled to the ID line 112 such that each a addressing port of each cell therein is coupled to the ID line 112. For example, that bank 204-1 is shown as having an array of cells 210 arranged in rows and columns. A addressing port of each of the cells 210 is coupled to the ID line 112. Banks 204-2 through 204-K are configured similarly. A particular one of the cells 210 can be accessed on the ID line 112 after selection using row and column select signals.

The banks 204-1 through 204-K receive row and column select signals from address generators 202-1 through 202-K (collectively address generators 202). Each of the address generators 202 includes a row shift register 206 and a column shift register 208. Each of the address generators receives dock signal(s) on the clock line(s) 116 and data signal(s) on the data line(s) 114. The row shift register 206 can include a plurality of register locations equal to the number of rows in the array of cells 210. The column shift register 208 can include a plurality of register locations equal to the number of columns in the array of cells 210.

The data signals (also referred to as control signals) can be used to push data into the row and column shift registers 206 and 208 using dock signals. For example, an active logic state (e.g., logic '1') can be pushed into the row shift register 206 to an Xth register location for selecting row X. An active logic state can be pushed into the column shift register 208 to a Yth register location for selecting column Y. In this manner, an address is generated for a cell 210 located in row X, column Y, allowing said cell to be accessed on the ID line 112. Notably, the row and column shift registers 206 and 208 can be configured in parallel in order to generate the desired address. This is more efficient than if a single shift register is used to generate both the row and column address, which would require row and column address information to be loaded serially.

Figure 3:
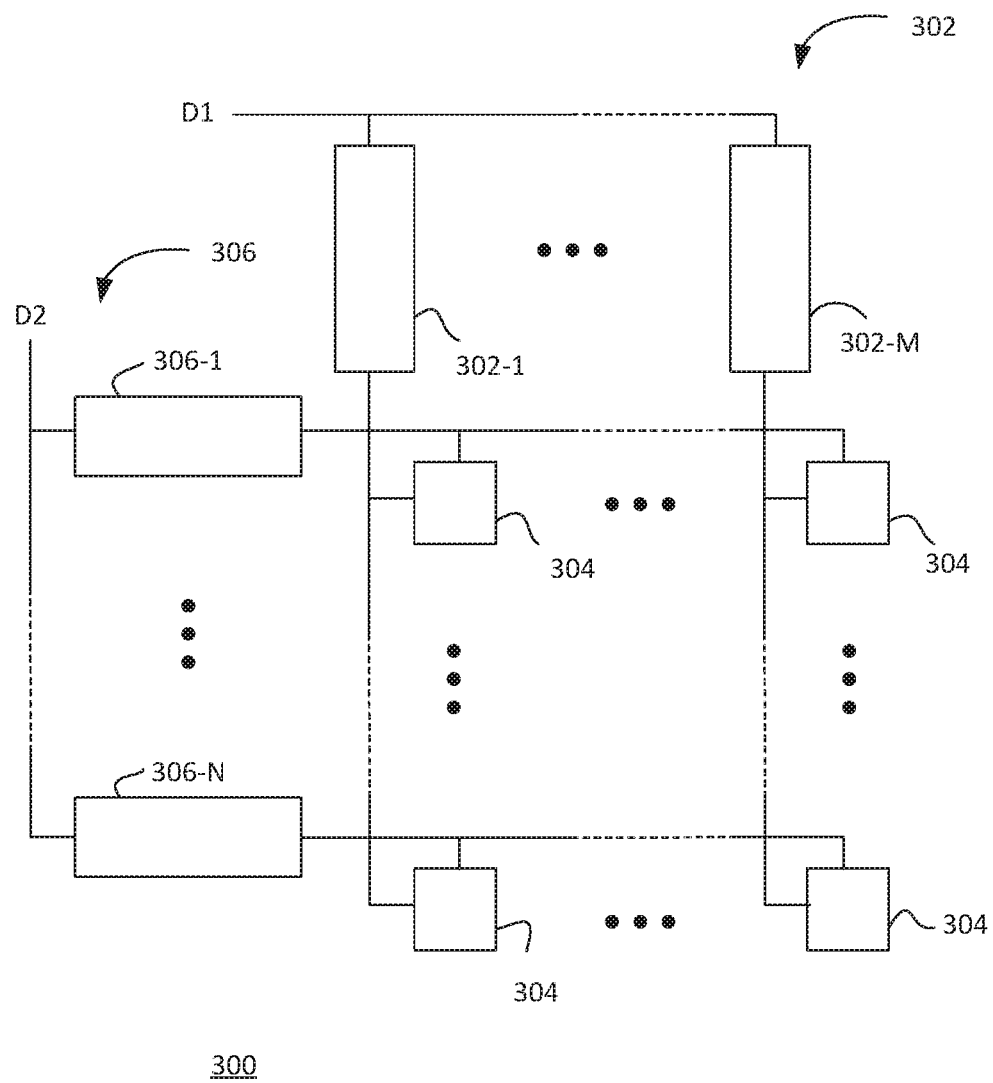
FIG. 3 is a block diagram depicting a more detailed portion of an EPROM subsystem according to an example implementation.

FIG. 3 is a block diagram depicting a more detailed portion of an EPROM subsystem 300 according to an example implementation. The EPROM subsystem 300 can comprise one bank and corresponding address generator of the subsystem in FIG. 2. Other banks/address generators in FIG. 2 can be configured similarly. The EPROM subsystem 300 includes a plurality of cells 304 arranged in rows and columns. A shift register 302 includes M register locations 302-1 through 302-M, where M is an integer greater than one. Each of the register locations 302-1 through 302-M is coupled to column select ports of the cells 304 in a particular column. Hence, the array of cells 304 includes M columns of cells. A shift register 306 includes N register locations 306-1 through 306-N, where N is an integer greater than one. Each of the register locations 306-1 through 306-N is coupled to row select ports of the cells 304 in a particular row. Hence, the array of cells 304 includes N rows of cells.

The shift register 302 receives a signal D1, and the shift register 306 receives a signal D2. The signals D1 and D2 may be provided on data lines, as described above. Clock inputs are omitted for clarity, but are shown in FIG. 2 and described above. In operation, the signal D1 can be used to store an active logic value in a particular register 302-Y to select column Y, and the signal D2 can be used to store an active logic value in a particular register 306-X to select row X. Hence, a cell 304 at row X, column Y can be selected and accessed (the ID line is omitted for clarity, but shown in FIG. 2 and described above.)

FIG. 4 is a schematic diagram showing an EPROM cell 400 according to an example implementation. The EPROM cell 400 includes transistors Q1 through Q3 and a resistor R1. The transistors Q1 and Q2 can be metal oxide field effect transistors (MOSFETs). The transistor Q3 can be a MOSFET with a floating gate. In an example, the transistors Q1 through Q3 are N-type (NMOS) devices, although a similar circuit can be constructed using PMOS or CMOS logic. A source of the transistor Q2 is coupled to a reference voltage (e.g., ground). A drain of the transistor Q2 is coupled to a source of the transistor Q1. The drain of the transistor Q1 is coupled to a source of the transistor Q3. A drain of the transistor Q3 is coupled to a terminal of the resistor R1. Another terminal of the resistor R1 is coupled to a addressing port of the cell 400. The gate of the transistor Q3 is also coupled to the addressing port. A gate of the transistor Q1 provides a column select port for receiving a column select signal. A gate of the transistor Q2 provides a row select port for receiving a row select signal. The transistor Q3 can be electrically accessed through the addressing port by switching on both the transistors Q1 and Q2.

The transistor Q3 is a floating-gate transistor in that the transistor Q3 includes two gates that are separated from one another by an oxide layer that acts as a dielectric. One of the gates is called a "floating gate" and the other is called a control gate or input gate. The floating gate's only link to the addressing port is through the control gate. A blank EPROM cell has all gates fully open, giving each cell a value of logic '0' (low resistance state). That is, the floating gate initially has no charge, which causes the threshold voltage to be low. To change the value of the bit to logic '1' (high resistance state), a programming voltage is applied to the control gate and drain (assuming the transistors Q1 and Q2 are switched on). The programming voltage draws excited electrons to the floating gate, thereby increasing the threshold voltage. The excited electrons are pushed through and trapped on the other side of the thin oxide layer, giving it a negative charge. These negatively charged electrons act as a barrier between the control gate and the floating gate. During use of the EPROM cell, a cell sensor can monitor the threshold voltage of the cell (assuming the transistors Q1 and Q2 are switched on). If the threshold voltage is low (below the threshold level), the cell has a value of logic '0'. If the threshold voltage is high (above the threshold level), the cell as a value of logic '1'.

FIG. 4 is one example structure of an EPROM cell that can be used with the circuits described above. In general, an EPROM cell must be able to store a bit of information in a non-volatile fashion and be accessible using row and column select signals.

Referring to FIG. 1, in some cases, the interface provided by the controller 102 includes limited data lines 114. For example, the controller 102 may provide four data signals for use by the printhead 104. In such an example, the DBS address circuits 110 only have four data signals to use to generate addresses for the EPROM 106. This would allow for a maximum of two uniquely addressable EPROM banks (two data signals for row and column selection in each bank). Notably, each cell in the EPROM is coupled to the same ID line for sensing. Thus, in cases where there are multiple banks of cells, two given banks cannot use the same input data signals for driving row and column shift registers, or else multiple cells would be coupled to the same ID line at the same time. More banks can be addressed given the same set of input data signals by multiplexing the data signals.

Figure 5:
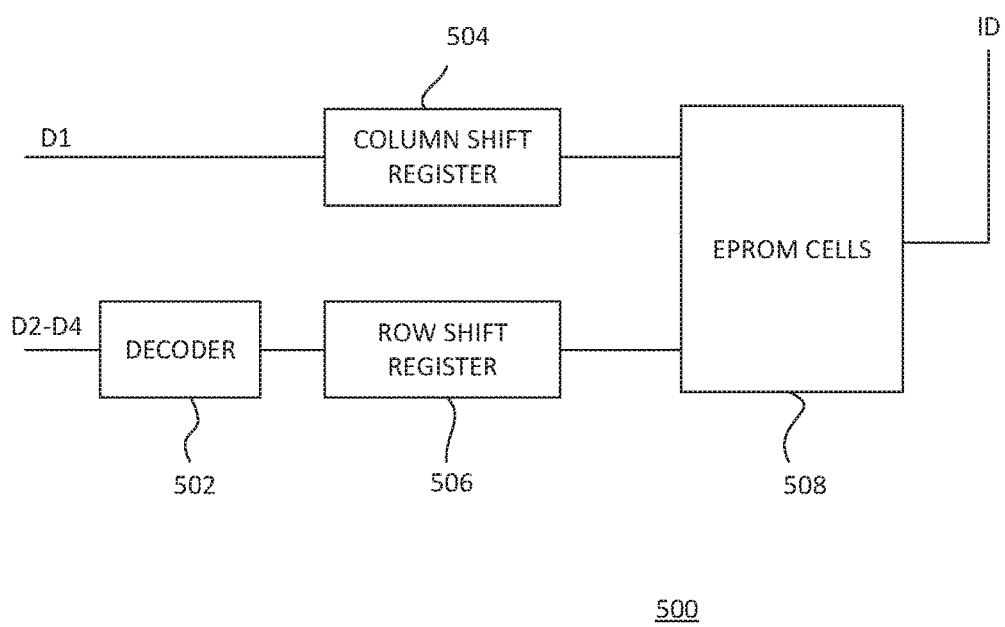
FIG. 5 is a block diagram depicting an EPROM subsystem according to an example implementation.

FIG. 5 is a block diagram depicting an EPROM subsystem 500 according to an example implementation. The EPROM subsystem 500 includes EPROM cells 508, a column shift register 504, a row shift register 506, and a decoder 502. The EPROM cells 508 comprise an array of cells in rows and columns as described above. The column shift register 504 and row shift register 506 provide row and column select signals to the EPROM cells 508 for select particular cells in the array as described above. The only difference from the above described configurations is the use of the input data signals. Above, it is assumed that two independent data signals are used to drive the row and column shift registers respectively (e.g., see FIG. 2). In the present example, one data signal D1 is used to drive the column shift register 504. A combination of data signals D2-D4 are coupled to the decoder 502, which produces a derived data signal for driving the row shift register 506. The decoder 502 can generate an active logic signal based on a particular combination of bits from D2-D4. This combination of bits on D2-D4 uniquely identifies this particular bank of EPROM cells 508. Since there are 8 different combinations possible given D1-D4, 8 different banks can be uniquely addressed given the same set of D1-D4. That is, the subsystem 500 can be replicated for other banks of EPROM cells, where these other decoders are responsive to different combinations of bits on D2-D4. This is merely one example configuration. In other examples, different numbers of data signals can be used in different combinations to address uniquely different numbers of EPROM banks.

In another example, a decoder can be used to multiplex data signals for the column shift register, rather than the row shift register. In another example, decoders can be used to multiplex data signals for both the column shift register and the row shift register.

In various examples described above, the EPROM can be divided into uniquely addressable banks of cells. Such a configuration requires a set of address generating row and column shift registers for each bank of EPROM cells. As each set of row and column shift registers utilize the same clock signals and potentially the same data signals (given data signal multiplexing), busses are required on the printhead to convey the signals among the different circuits. Referring to FIG. 2, in one example, K equals one and there is only a single bank of 204-1 of EPROM cells. In order to store the same amount of information as the multi-bank example, a single-bank example must have a larger array of EPROM cells.

For example, consider an example where there are 8 banks of 8×8 EPROM cells for a 512-bit EPROM. For each bank, row and column shift registers would have 8 register locations. The same 512-bit EPROM can be configured into a single bank of EPROM cells having, for example, 16 columns and 32 rows. In such an example, the row shift register would have 32 register locations and the column shift register would have 16 register locations. Busses could be eliminated as only a single set of row and column shift registers are used.

Figure 6:
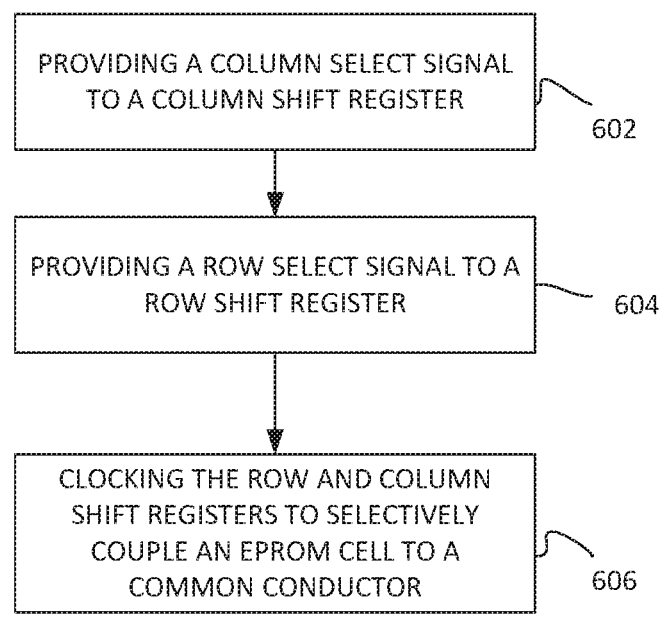
FIG. 6 is a flow diagram depicting a method of addressing an EPROM on a printhead according to an example implementation.

FIG. 6 is a flow diagram depicting a method 600 of addressing an EPROM on a printhead according to an example implementation. The method 600 begins at step 602, where a column select signal is provided to a column shift register. At step 604, a row select signal is provided to a row shift register. At step 606, the row and column shift registers are docked to selectively couple an EPROM cell to a common conductor (e.g., the ID line described above). In an example, the column select signal and row select signal are derived from a plurality of external control signals (e.g. provided by the controller 102 in FIG. 1). In an example, at least one of the column and row select signals is derived from a combination of the external control signals (e.g., using a decoder, as described above).

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An electronically programmable read-only (EPROM) system to output data from an EPROM memory unit, the system, comprising:
   the EPROM memory unit comprising a plurality of cells arranged in rows and columns, each of the cells to store a data bit, and each of the cells having a addressing port, a row select port, and a column select port;
   a data line coupled to the addressing port of each of the plurality of cells;
   a column shift register coupled to the column select ports of the plurality of cells, the column shift register having a register location for each column of the plurality of cells and having an input to receive a first input signal; and
   a row shift register coupled to row select ports of the plurality of cells, the row shift register having a register location for each row of the plurality of cells and having an input to receive a second input signal.

2. The EPROM system of claim 1, wherein each of the plurality of cells is addressable in the EPROM memory unit using the first input signal and the second input signal, and wherein a logic state of an addressed cell in the plurality of cells is readable using the data line.

3. The EPROM system of claim 1, wherein the column shift register and row shift register are operable to shift data from one register location to a next register location therein using at least one clock signal.

4. The EPROM system of claim 1, further comprising:
   a controller interface to receive a plurality of external control signals from which the first and second input signals are derived.

5. The EPROM system of claim 4, wherein the first input signal is one of the external control signals, and the EPROM system further comprises a decoder to receive a plurality of the external control signals and generate therefrom the second input signal.

6. The EPROM system of claim 1, further comprising:
   a plurality of different banks of cells, the cells of each bank arranged in rows and columns; and
   a separate row shift register and column shift generator for each bank of cells.

7. The EPROM system of claim 6, wherein the data line is connected to each of the cells in all of the banks of cells.

8. The EPROM system of claim 1, wherein the column and row shift registers are connected to receive the first and second input signals in parallel.

9. The EPROM system of claim 1, wherein each cell comprises three transistors, a first transistor having a gate connected to the column select port of the cell, a second transistor having a gate connected to the row select port of the cell, and the third transistor having a gate connected to the data line.

10. The EPROM system of claim 9, wherein the third transistor is a floating gate transistor configured to store a data bit.

11. The EPROM system of claim 9, wherein a drain of the third transistor is connected through a resistor to the data line.

12. The EPROM system of claim 9, wherein a source of the first transistor is connected to a reference voltage.

13. The EPROM system of claim 12, wherein the three transistors are connected between ground and the data line.

14. An electronically programmable read-only (EPROM) system, comprising:
- an electronically programmable read-only memory (EPROM) having a plurality of banks, each of the plurality of banks having a plurality of cells arranged in rows and columns, each of the cells having a addressing port, a row select port, and a column select port;
- a conductor coupled to the addressing port of each of the plurality of cells in each of the plurality of banks;
- a column shift register for each of the plurality of banks, each column shift register having register locations for the plurality of cells in the respective bank and being coupled to the column select ports thereof; and
- a row shift register for each of the plurality of banks, each row shift register having a register locations for the plurality of cells in the respective bank and being coupled to the row select ports thereof.

15. The EPROM system of claim 14, further comprising:
- a controller interface to receive a plurality of extemal control signals from which a plurality of input signals can be derived for driving each column and row shift register.

16. The EPROM system of claim 15, wherein the plurality of input signals includes a plurality of signal pairs, one for each of the plurality of banks, each of the plurality of signal pairs for a respective bank including a signal for the row shift register and a signal to the column shift register.

17. The EPROM system of claim 15, wherein one of the external control signals is coupled to an input of the column shift register in each of the banks, and the system further comprises:
- a decoder for each of the plurality of banks, each decoder to receive a plurality of the extemal control signals and generate an input signal for each respective row shift register.

18. A method of addressing an electronically programmable read-only memory (EPROM), comprising:
- providing a column select signal to a column shift register having a register location for each column of cells in the EPROM;
- providing a row select signal to a row shift register having a register location for each row of cells in the EPROM; and
- clocking the column shift register and the row shift register to selectively couple a cell in the EPROM to a common conductor.

19. The method of claim 18, further comprising:
- receiving a plurality of external control signals; and
- deriving the column select signal and the row select signal from the external control signals.

20. The method of claim 19, wherein deriving the column select signal comprises:
- selecting one of the external control signals as the column select signal; and
- multiplexing a plurality of the external control signals to derive the row select signal.

* * * * *